(12) United States Patent
Mok et al.

(10) Patent No.: US 6,466,426 B1
(45) Date of Patent: Oct. 15, 2002

(54) METHOD AND APPARATUS FOR THERMAL CONTROL OF A SEMICONDUCTOR SUBSTRATE

(75) Inventors: Yeuk-Fai Edwin Mok, San Francisco; Dmitry Lubomirsky, Cupertino; Dennis Koosau, Hayward; Danny Wang, San Jose; Senh Thach, Union City; Paul Exline, Santa Clara, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/366,155

(22) Filed: Aug. 3, 1999

(51) Int. Cl.[7] .............................................. H01N 13/00
(52) U.S. Cl. ...................... 361/234; 361/707; 257/717; 279/128
(58) Field of Search ................................. 361/234, 704, 361/707, 699; 279/128; 118/724, 725; 219/618, 632, 634, 638, 647, 651, 677; 257/706, 712, 713, 714, 717

(56) References Cited

U.S. PATENT DOCUMENTS

| 5,764,471 A | 6/1998 | Burkhart ...................... 361/234 |
| 5,796,074 A | 8/1998 | Edelstein et al. ........... 219/390 |

*Primary Examiner*—Ronald W. Leja
(74) *Attorney, Agent, or Firm*—Moser, Patterson, Sheridan; Joseph Bach

(57) ABSTRACT

A semiconductor wafer processing apparatus, and more specifically, a semiconductor substrate support pedestal having a substrate support, an isolator, and first and second heat transfer plates for providing a controllable, uniform temperature distribution across the diameter of a semiconductor wafer. A semiconductor wafer placed upon the pedestal is maintained uniformly at a predetermined temperature by heating the wafer with one or more electrodes embedded within the substrate support and cooling the wafer with a fluid passing through the first and second heat transfer plates.

27 Claims, 4 Drawing Sheets

METHOD AND APPARATUS FOR THERMAL CONTROL OF A SEMICONDUCTOR SUBSTRATE

BACKGROUND OF THE DISCLOSURE

1. Field of Invention

The present invention relates generally to a semiconductor wafer processing apparatus. More specifically, the invention relates to a semiconductor support pedestal for providing a controllable, uniform temperature distribution across the diameter of a semiconductor wafer.

2. Background of Prior Art

In semiconductor wafer processing, the surface temperature of the wafer is a critical process parameter. Changes in, and gradients across the wafer surface during wafer processing are detrimental to material deposition, etch rate, feature taper angles, step coverage and the like. It is essential to have control over temperature uniformity during wafer processing to enhance processing and minimize undesirable characteristics.

A number of devices have been used in the art to control wafer temperature during processing. One method feeds a chilled fluid through a wafer support pedestal during wafer processing. The fluid removes heat from the wafer support pedestal thus cooling the wafer. This method of cooling the wafer has two inherent problems. First, the response time required to bring a wafer to a desired temperature is relatively long. As such, rapid dynamic control of the water temperature to compensate for rapid wafer temperature fluctuations is not possible. Consequently, the wafer is not maintained as a constant temperature.

A second disadvantage of this method is the inability to control the temperature uniformity across the surface of the wafer. Heat transfer from the wafer to the wafer support pedestal is generally greatest in the center of the wafer and less towards the edges. Since the fluid temperature is generally uniform inside the wafer support pedestal, the wafer cools more rapidly in the center. This causes a temperature gradient across the wafer surface, becoming more severe with increased diameter wafers, e.g., 300 mm. This temperature gradient is one of the primary causes of feature variation in semiconductor wafer processing.

Another method of controlling wafer temperature that provides rapid dynamic control of the pedestal temperature uses thermo-electric devices embedded in the pedestal surface that supports the wafer (i.e., the support surface). These devices are. oriented in a planar array below the support surface of the pedestal. However, within such an array, temperature gradients form between the individual devices, i.e., each device effectively transfers heat at its location while a lesser amount of heat is transferred at the locations immediately adjacent to and between the devices. Such gradients between a plurality of devices cause substantial temperature variation across the wafer, i.e., hot and cold locations are formed. Consequently, process variations may occur across the wafer in response to the temperature variations.

Recently advances in etching what is considered exotic materials, for example copper and iridium, have aggravated the problems of controlling wafer temperatures and temperature uniformity. The high bias power (up to and exceeding 1000 Watts) applied to electrostatic chucks used in etching some exotic materials have contributed significantly to the heat load upon a wafer, requiring cooling of the pedestal in excess of known means. Additionally, the processing temperatures used in etching some exotic materials require temperatures in the range of 200 to 400 degrees Celsius. Such high processing temperatures require a pedestal that can quickly bring a wafer up to and maintain a predetermined processing temperature.

Therefore, there is a need in the art for an apparatus which can quickly bring and maintain a wafer at a predetermined temperature and provide a uniform temperature across the wafer support surface of a wafer support pedestal.

SUMMARY OF INVENTION

The disadvantages associated with the prior art are overcome by the present invention of a support pedestal for supporting and thermally controlling a semiconductor substrate, i.e., a wafer. The support pedestal has a substrate support, an isolator, an internal plate and an external plate. The substrate support is an electrostatic chuck, a heater, a ceramic body or the like. The isolator, preferably fabricated from a ceramic or other material having low thermal conductivity, has an internal diameter that defines an internal volume. The isolator is fastened between the substrate support and the external plate. The internal plate is fastened to the isolator. The internal plate and substrate support define a gap vented to atmosphere. Both the internal plate and the external plate have internal passages for circulating a heat transfer fluid.

A second embodiment of the invention comprises a support pedestal having a substrate support, an isolator, an internal plate and an external plate. The substrate support is an electrostatic chuck, a heater, a ceramic body or the like. The isolator has an internal diameter that defines an internal volume. The isolator is fastened between the substrate support and the external plate. The internal plate is fastened to the substrate support. The internal plate has a ring shaped section that defines a volume, separating a first section from a second section. The first section is fastened to the substrate support. Both the second section of the internal plate and the external plate have internal passages for circulating a heat transfer fluid.

A process for thermal control of the wafer is also disclosed. Control of the wafer temperature is facilitated by transferring heat between a substrate support and a fluid circulating within an external plate disposed beneath the substrate support. The external plate is separated from the substrate support by an isolator. Heat is transferred to a fluid circulating within the external plate. Additionally, heat is transferred between the substrate support and the fluid circulating within an internal plate that is disposed beneath the substrate support. Another embodiment of the preferred method includes transferring heat through a ring section in the internal place prior to transferring the heat to the fluid. Other embodiments of the method include sensing the wafer temperature and providing a signal that causes one or more electrodes within the substrate support to generate heat.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

Figure 1:
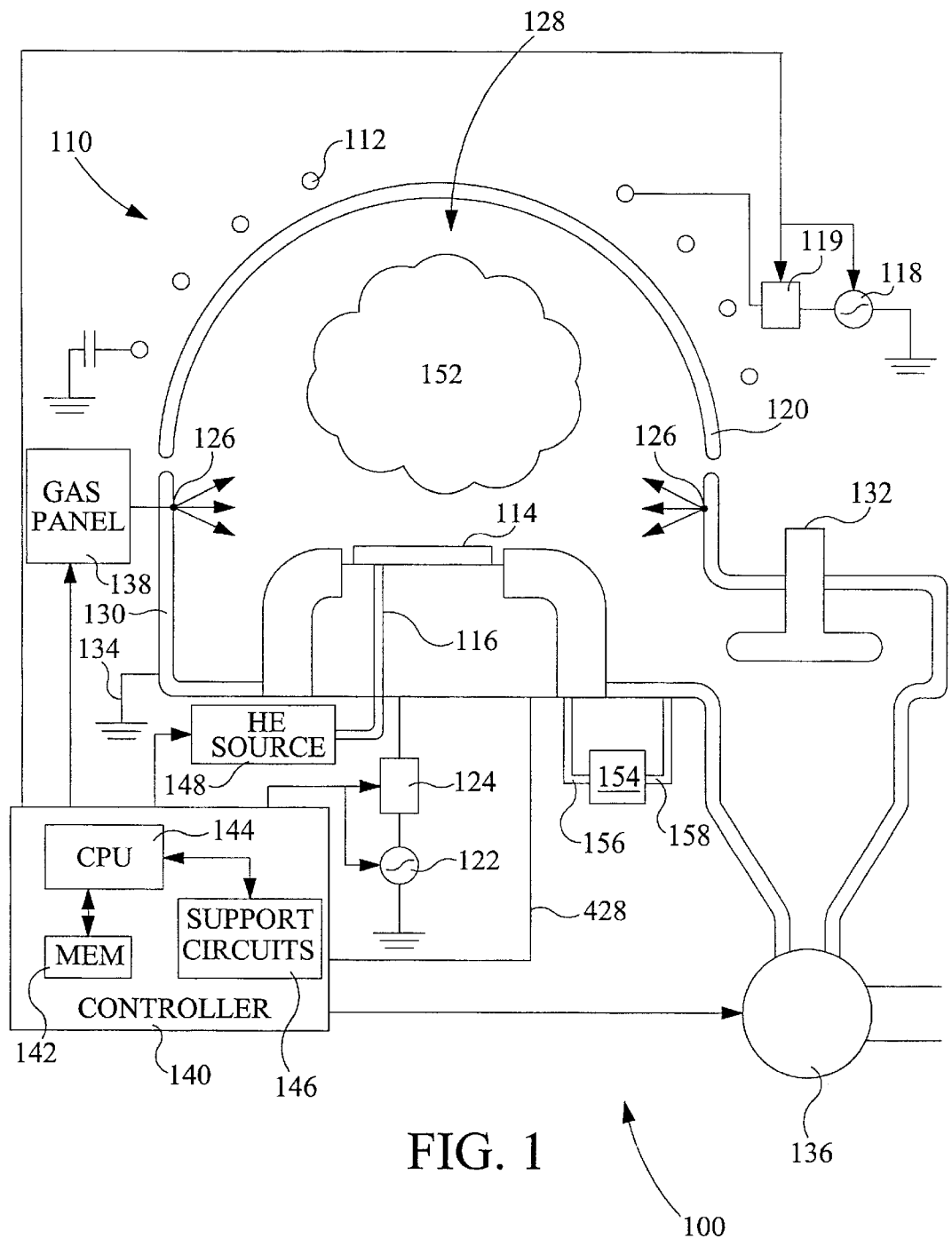
FIG. 1 is a cross-sectional schematic of an illustrative semiconductor processing chamber containing a thermal control pedestal in accordance with the subject invention.

The present invention depicted in FIG. 1 is part of a semiconductor processing system 100. An illustrative example of such a system is a Decoupled Plasma Source (DPS) Centura® etch system, available from Applied Materials, Inc. of Santa Clara, Calif. The system 100 has a substrate support or support pedestal 116 for maintaining a semiconductor substrate or wafer 114 at a predetermined temperature during wafer processing. The inventive support pedestal 116 has utility in any number of semiconductor processing systems where temperature control and temperature uniformity of the wafer 114 is required. One skilled in the art will appreciate that the teachings disclosed herein are readily adaptable for use in various other applications (i.e., physical and chemical vapor deposition semiconductor processing systems) where temperature control and uniformity of the wafer 114 is required.

The system 100 comprises a chamber 110 and a controller 140. The system 100 is connected to various sources such as a gas panel 138, a heat transfer gas source 148, a first power source 118, a second power source 122, and a fluid supply 154. The chamber 110 has a conductive chamber wall 130 that is connected to an electrical ground 134 and a dielectric, dome-shaped ceiling or lid 120. The chamber wall 130 and the lid 120 defines a chamber volume 128. The chamber volume 128 is typically below atmospheric pressure during wafer processing. At least one inductive coil antenna segment 112 is positioned exterior to the lid 120. The antenna segment 112 is coupled to the first power source 118 that is generally capable of producing an RF signal having a tunable frequency of about 12.56 MHz. The first power source 118 is coupled to the antenna 112 through a matching network 119.

Disposed within the process chamber 110 is the support pedestal 116. The support pedestal 116 is coupled to the second power source 122. The second power source 122 is generally capable of producing an RF signal having a frequency of approximately 13.56 MHz. The second power source 122 is coupled to the support pedestal 116 through a matching network 124. The heat transfer gas source 148 is coupled to the support pedestal 116. A heat transfer gas, i.e., helium gas, flows from the heat transfer gas source 148 to channels (not shown) between the wafer 114 the support pedestal 116. The helium gas is used to facilitate heat transfer between the substrate 114 and the support pedestal 116.

The fluid supply 154 is coupled to the support pedestal 116 by a first conduit 156. The fluid supply 154 is also coupled to passages (not shown) in the chamber walls 130 by a second conduit 158. The fluid supply 154 typically flows facility's water at 80 degrees Celsius to assist in regulating the temperature of the support pedestal 116 and the chamber walls 130. Other fluids may be readily substituted for the facility's water. Additionally, alternate fluid temperatures may be used when different processing conditions are required.

The gas panel 138 provides process gas (or gases) and other gases used to facilitate wafer 114 processing. The process gas, for example Argon, is delivered from the gas panel 138 into the chamber 110 through ports 126, forming a plasma 152 when power is supplied between the support pedestal 116 and the chamber walls 130 by the second power source 122. The pressure within the chamber volume 128 is controlled (typically below atmospheric pressure during wafer processing) using a throttle valve 132 situated between the chamber 110 and a vacuum pump 136.

The controller 140 comprises a central processing unit (CPU) 144, a memory 142, and support circuits 146 for the CPU 144. The controller 140 is coupled to the various components of the chamber 110 to facilitate control of wafer processing.

Figure 2:
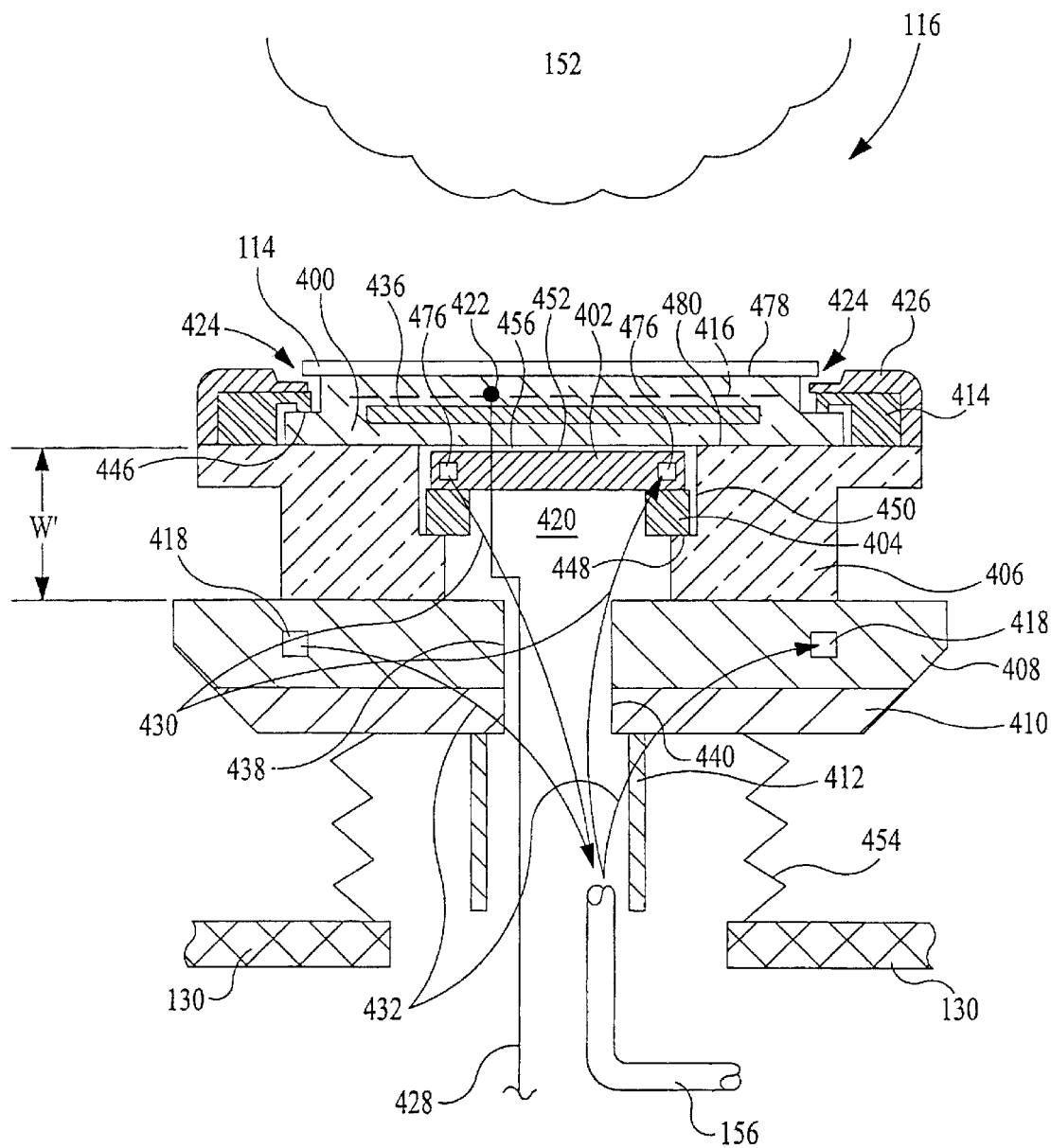
FIG. 2 is a cross-sectional schematic of a first embodiment of the thermal control pedestal of the subject invention.

One embodiment of the support pedestal 116 is depicted in greater detail in FIG. 2. The support pedestal 116 has a substrate support 400, an internal heat transfer plate 402, a spacer 404, an isolator 406, an external heat transfer plate 408, a housing 410, a shaft 412 and clamp 414. The substrate support 400 can be an electrostatic chuck, a heater a ceramic body, or the like. The substrate support 400 has a first or substrate side 478, a second side 480, and a circumferencial flange 446. The substrate support 400 is typically a brazeable ceramic such as pyrolytic boron nitride, aluminum nitride, silicon nitride, alumina and the like. A sensor 422 is positioned in the substrate support 400 proximate the substrate side 478. The sensor 422 is coupled to the controller 140 (see FIG. 1) via the connection 428. The clamp 414 holds the flange 446 of substrate support 400 against the isolator 406. The clamp 414 is fastened to the isolator 406 typically by bolts (not shown). A cover ring 426 is disposed above the clamp 414. The cover ring 426 protects the clamp 414 and an exposed portion 424 of the substrate support 400 from being etched by the plasma 152.

One or more electrodes are embedded in the substrate support 400. The one or more electrodes may be used for various requirements of semiconductor substrate processing including chucking, heating, RF power distribution and the like via connections to one or more power sources (i.e., source 122 or alternately a DC power source). It is preferred that the one or more electrodes comprise at least a first electrode 416 and a second electrode 436. The first electrode 416 is typically used for electrostatically retaining the wafer 114 to the substrate side 478 of the substrate support 400. The second electrode 436 is used to heat the wafer 114.

The isolator 406 has an internal diameter 450 and a thickness W'. The internal diameter 450 has a step 448. The isolator 406 is fabricated from ceramic or other material having low thermal conductivity. The isolator 406 is disposed between the substrate support 400 and the external heat transfer plate 408. The internal diameter 450 and the substrate support 400 define an internal volume 420. The external heat transfer plate 408 is fabricated from a metallic material. The external heat transfer plate 408 has a central passage 438 and an internal passage 418. The internal passage 418 within the external heat transfer plate 408 is coupled to the fluid supply 154 (see FIG. 1) by the first conduit 156 allowing the facility's water to be circulated through the external heat transfer plate 408 as depicted by arrows 432. The housing 410 has a central passage 440 that is coaxial with the central passage 438 of the external heat transfer plate 408. The central passages 438 and 440 facilitate access to the internal volume 420 from the shaft 412, allowing the internal volume 420 to be vented to the atmosphere through the shaft 412. Hardware such as screws, bolts and other fasteners that facilitate disassembly are preferably used for fastening the components of the support pedestal 116. However, other fastening hardware and methods such as clamps, rivets, brazing, welding and the like may be substituted.

The housing 410 of the support pedestal 116 is attached (i.e., brazed) to a bellows 454. The bellows 454 is also attached to the chamber wall 130. The bellows 454 isolates the internal volume 420 from the chamber volume 128. The use of the bellows 454 to isolate the internal volume 420 can be found in greater detail in the commonly assigned U.S. Pat. No. 5,511,799, issued Apr. 30. 1996, hereby incorporated by reference. In this fashion, the bellows 454 allows the internal volume 420 to remain vented to the atmosphere during system 100 operation.

The spacer 404 has a ring shape and is disposed upon the step 448 of the isolator 406. The internal heat transfer plate 402 is disposed upon the spacer 404. Both the spacer 404 and the internal heat transfer plate 402 reside within the internal volume 420. The internal heat transfer plate 402 is preferably fabricated from a metallic or other thermally conductive material. The internal heat transfer plate 402 has passages 476 and a surface 452. The passages 476 are coupled to the fluid supply 154 (see FIG. 1) by the first conduit 156 allowing facility's water to be circulated through the internal heat transfer plate 402 as depicted by arrows 430. The internal heat transfer plate 402 and the second side 480 of the substrate support 400 define a gap 456. Since air present in the internal volume 420 fills the gap 456, heat transfer between the internal heat transfer plate 402 and the substrate support 400 occurs across the gap 456 by convection, conduction and radiation.

The operation of the system 100 is best understood by referring to FIG. 1 and FIG. 2 simultaneously. One skilled in the art will recognize that the support pedestal 116 can be advantageously utilized wherever temperature control and temperature uniformity of a wafer 114 are required and that the use in the system 100 and the process ranges disclosed are by way of example and is for illustration only. The wafer 114 is placed atop the substrate support 400 of the support pedestal 116. Helium is supplied from the heat transfer gas source 148 between the wafer 114 and the support pedestal 116 to facilitate heat transfer between the wafer 114 and the support pedestal 116. The wafer 114 is brought up to a predetermined processing temperature in the range of 200–500 degrees Celsius by applying power from the second power source 122 to the second electrode 436. Typically, the wafer 114 heated by the second electrode 436 will arrive at the predetermined temperature in less than 20 seconds. After a wafer 114 is positioned upon the substrate support 400 and the chamber volume 128 is evacuated by the pump 136, process gas from the gas panel 138 is introduced into the chamber volume 128 through the ports 126 of the chamber wall 130. The gas is excited into the plasma 152 by applying up to 2500 Watts from the first power supply 118 to the antenna 112. The wafer 114 is retained upon the support pedestal 116 by applying up to 1000 Watts from the second power supply 122 to the first electrode 416. The voltages ionizes the process gas within the plasma 152, resulting in the wafer 114 being etched.

During processing, the wafer 114 is subjected to thermal energy from a variety of sources, i.e., from the plasma 152, the one or more electrodes (416 and 436), and the like. To counteract the thermal energy impinging upon the wafer 114, thermal energy is removed from the wafer 114 by facility's water from the fluid supply 152 flowing through the passages 476 and 418 of the internal heat transfer plate 402 and the external heat transfer plate 408, respectively. One skilled in the are will recognize that other cooling fluids, such as ethylene glycol and the like, may be readily substituted for the facility's water. The primary path of heat transfer is from the wafer 114, through the substrate support 400, across the gap 456, into the internal heat transfer plate 402 and into the facility's water flowing through the passages 476. The rate of heat transfer across this path can be varied by changing the material composition of the substrate support 400 and the internal heat transfer plate 402, the size of the gap 456, and the composition of the gas filling the internal volume 432. As air typically provides the heat transfer medium in the gap 456 (i.e., the gap being part of the internal volume 432), changing the pressure (and thus the density of air) within the gap 456 will correspondingly change the rate of heat transfer. Substituting another gas (i.e., nitrogen) for air will also change the rate of heat transfer across the gap 456.

The secondary path of heat transfer is from the wafer 114, through the substrate support 400, around the isolator 406, into the external heat transfer plate 408 and into by facility's water flowing through the passage 418. By "around the isolator 406" it is meant that although the isolator 406 has low thermal conductivity, the majority of heat traveling along the secondary path does not pass through the isolator 406. Heat passes "around the isolator" by propagating through the air residing in the internal volume 420 and gases (albeit minimally) in the chamber volume 128. Heat also passes "around the isolator" by traveling from the substrate support 400 to the external heat transfer plate 408 through the hardware holding the support pedestal 116 together. The rate of heat transfer across this path can be varied by changing the material composition of the substrate support 400, the isolator 406 and the external heat transfer plate 408. Additionally, the rate of heat transfer "around the isolator" is also changed by altering the thickness W' of the isolator 406.

As the rate of heat transfer of the primary path exceeds the rate of heat transfer of the secondary path, the tendency of the wafer 114 to heat and cool more quickly in the center is compensated. Thus, uniform temperature gradient is maintained across the wafer diameter. The actual heat transfer rates and balance between the primary and secondary paths are dependent on the pedestal/wafer geometry and the processing parameters to which the wafer 114 is to be subjected.

In order to maintain the predetermined temperature at the wafer 114, the rate of heat transfer to and from the wafer 114 must be balanced. The controller 140 facilitates the balancing of the rate of heat transfer to and from the wafer 114. The sensor 422 residing in the substrate support 400 communicates with the controller 140, supplying wafer temperature information. If the controller 140 determines that the wafer 114 requires heating, the controller 140 sends a signal to the second electrode 436, causing the heat generated by such second electrode 436 and transferred to the wafer 114 to exceed the heat removed from the wafer 114 by the facility's water (i.e., a net increase in thermal energy of the wafer 114). If the controller 140 determines that heat needs to be removed from the wafer 114, the controller 140 sends a signal to the second electrode 436, causing the heat generated by the second electrode 436 and transferred to the wafer 114 to be exceeded by the heat removed from the wafer 114 by the facility's water (i.e., a net decrease in thermal energy of the wafer 114). The sensor 422 and the controller 140 continually monitor the wafer 114 temperature, sending the appropriate signals to the second electrode electrode 436 as to maintain the wafer 114 at a predetermined temperature.

Since the heating and cooling requirements vary dependent on the type of process being performed in the chamber, the attributes listed above may be varied by one skilled in the arts to optimally handle the expected wafer heat load requirements for a specific application.

Figure 3:
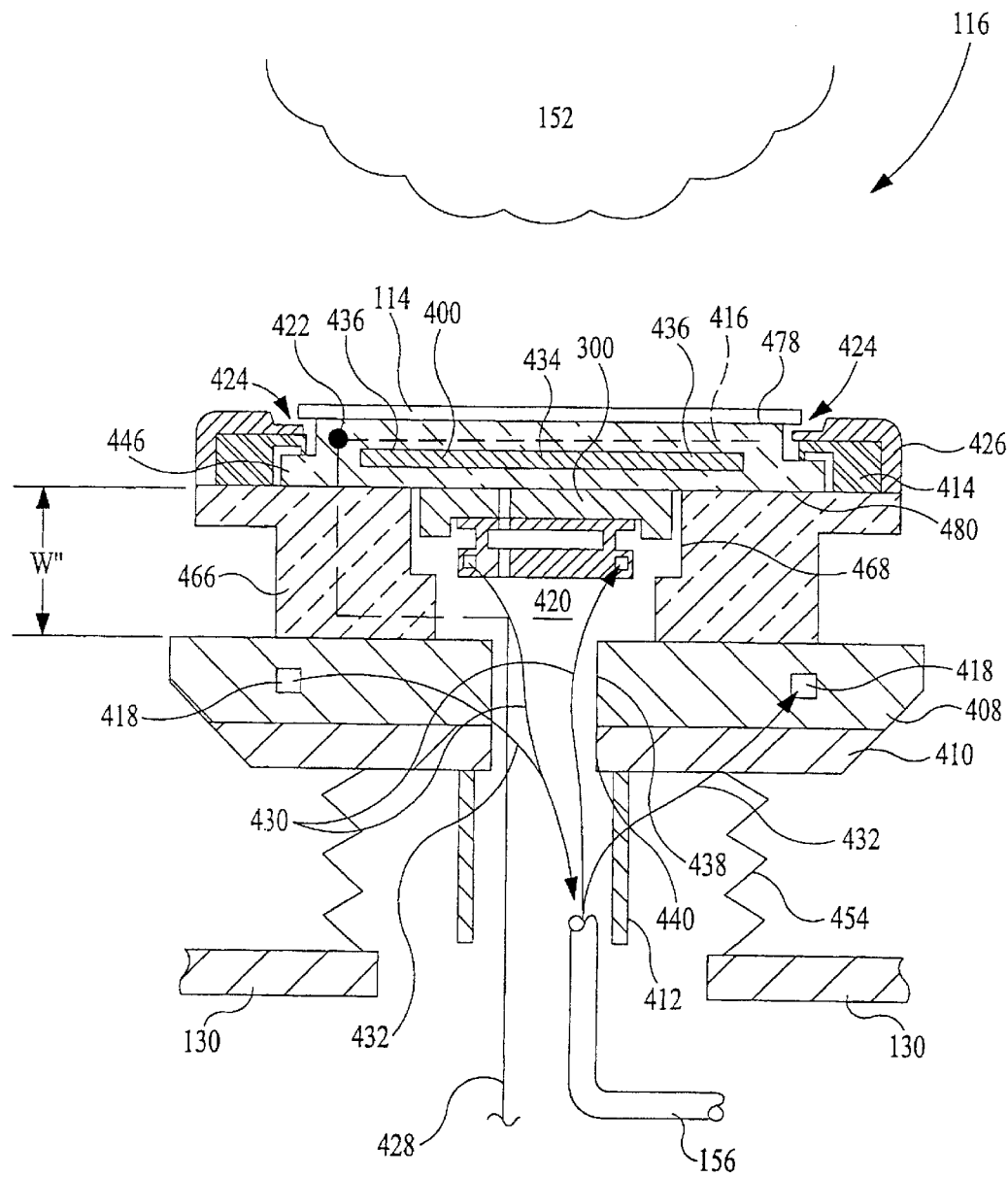
FIG. 3 is a cross-sectional schematic of a second embodiment of a thermal control pedestal of the subject invention.

A second embodiment of the support pedestal 116 is depicted in FIG. 3. The support pedestal 116 comprises a substrate support 400, an internal heat transfer plate 300, an isolator 466, an external heat transfer plate 408, a housing 410, a shaft 412 and clamp 414. The substrate support 400 can be an electrostatic chuck, a heater, a ceramic body or the like. A sensor 422 is positioned in the substrate support 400 near a substrate side 478. The sensor 422 is coupled to the controller 140. The clamp 414 holds the flange 446 of substrate support 400 against the isolator 466. The clamp 414 is fastened to the isolator 466 typically by bolts (not shown). A cover ring 426 is disposed above the clamp 414. The cover ring 426 protects the clamp 414 and exposed portion 424 of the substrate support 400 from being etched by the plasma 152.

One or more electrodes are embedded in the substrate support 400. The one or more electrodes may be used for various requirements of semiconductor substrate processing including chucking, heating, RF power distribution and the like via connections to one or more power sources (i.e., source 122 or alternately a DC power source). It is preferred that the one or more electrodes comprise at least a first electrode 416 and a second electrode 436. The first electrode 416 is typically used for electrostatically retaining the wafer 114 to the substrate side 478 of the substrate support 400. The second electrode 436 is used to heat the wafer 114.

The isolator 466 has an internal diameter 468 and a thickness W″. The internal diameter 468 and the substrate support 400 define an internal volume 420. The isolator 466 is fabricated from ceramic or other material having low thermal conductivity. The isolator 466 is disposed between the external heat transfer plate 408 and the substrate support 400. The external heat transfer plate 408 is fabricated from a metallic material. The external heat transfer plate 408 has a central passage 438 and an internal passage 418. The internal passage 418 within the external heat transfer plate 408 is coupled to the fluid supply 154 (see FIG. 1) by the first conduit 156 allowing the facility's water to be circulated through the external heat transfer plate 408 as depicted by arrows 432. The housing 410 is fastened to the shaft 412. The housing 410 has a central passage 440 that is aligned with the central passage 438. The passages 438 and 440 allow access to the internal volume 420 from the shaft 412, and allow for the internal volume to be vented to the atmosphere through the shaft 412. Hardware such as screws, bolts and other fasteners that facilitate disassembly are preferably used for fastening the component of the support pedestal 116. However, other fastening hardware and methods such as clamps, rivets, brazing, welding and the like may be substituted.

The housing 410 of the support pedestal 116 is attached (i.e., brazed) to a bellows 454. The bellows 454 is also attached to the chamber wall 130. The bellows 454 isolates the internal volume 420 from the chamber volume 128. In this fashion, the bellows 454 allows the internal volume 420 to remain vented to the atmosphere during system 100 operation.

Figure 4:
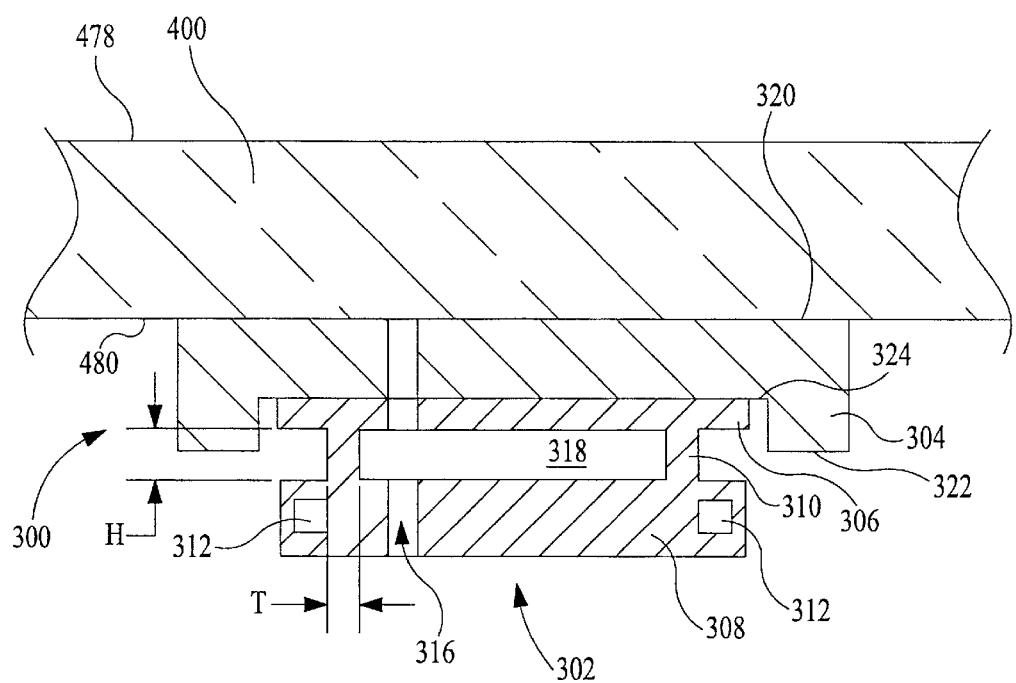
FIG. 4 is a cross-sectional schematic of an internal and an external heat transfer plates of the embodiment of FIG. 3.

The internal heat transfer plate 300 resides within the internal volume 420. The internal heat transfer plate 300, depicted in greater detail in FIG. 4, is comprised of a control plate 302 and a contact plate 304. Both the control plate 302 and the contact plate 304 are fabricated from metallic or other thermally conductive material. The control plate 302 has a first disk-shaped portion 306 and a second disk-shaped portion 308. A ring 310, having a thickness T and a height H connects the first disk-shaped portion 306 to the second disk-shaped portion 308. A volume 318 is defined by the first disk-shaped portion 306, the second disk-shaped portion 308 and the ring 310. The second disk-shaped portion 308 has a vent 316 which allows the volume 318 to communicate with the internal volume 420. Since air present in the internal volume 420 fills the volume 318, heat transfer occurs across the volume 318 by convection, conduction and radiation. The second disk-shaped portion 308 additionally has passages 312. The passages 312 are coupled to the fluid supply 154 (see FIG. 1) by the conduit 156 allowing the facility's water to be circulated through the second disk-shaped portion 308 as depicted by arrows 430 of FIG. 3.

The contact plate 304 has a first side 320 and a second side 322. The second side 322 has a counterbore 324 into which the first disk-shaped portion 306 of the control plate 302 is disposed. The first side 320 of the contact plate 304 is disposed against the second side 480 of the substrate support 400. The reader should note that the configuration of the contact plate 304 and the control plate 302 may be readily varied as long as the ring 310 remains disposed within the internal heat transfer plate 300.

The operation of the system 100 is best understood by referring to FIG. 1, FIG. 3 and FIG. 4 simultaneously. One skilled in the art will recognize that the support pedestal 116 can be advantageously utilized wherever temperature control and temperature uniformity of a wafer 114 is required and that the use in the system 100 and the process ranges disclosed are by way of example and are for illustration only. The wafer 114 is placed atop the substrate support 400 of the support pedestal 116. Helium is supplied from the heat transfer gas source 148 between the wafer 114 and the support pedestal 116 to facilitate heat transfer between the wafer 114 and the support pedestal 116. The wafer 114 is brought up to a predetermined processing temperature in the range of 200–500 degrees Celsius by applying power from the second power source 122 to the second electrode 436. Typically, the wafer 114 heated by the second electrodes 436 will arrive at the predetermined temperature in less than 20 seconds. After a wafer 114 is positioned upon the substrate support 400 and the chamber volume 128 is evacuated by the pump 136, process gas from the gas panel 138 is introduced into the chamber volume 128 through the ports 126 of the chamber wall 130. The gas is excited into the plasma 152 by applying approximately 2500 Watts from the first power supply 118 to the antenna 112. The wafer 114 is retained upon the support pedestal 116 by applying up to 1000 Watts to the first electrode 416. The resultant plasma ignition and the support pedestal 116 biasing results in the wafer 114 being etched.

During processing, the wafer 114 is subjected to thermal energy from a variety of sources, i.e., from the plasma 152, the one or more electrodes (416 and 436), and the like. To counteract the thermal energy impinging upon the wafer 114, thermal energy is removed from the wafer 114 by facility's water from the fluid supply 152 flowing through the passages 312 and 418 of the internal heat transfer plate 300 and the external heat transfer plate 408, respectively. There are two primary paths of heat transfer from the wafer 114. The first primary path is from the wafer 114, through the substrate support 400, through the contact plate 304, into the first disk-shaped portion 306 of the control plate 302, across the volume 318, into the second disk-shaped portion 308 and into by the facility's water flowing through the passage 312. The rate of heat transfer across this path can be varied by changing the material composition of the substrate support 400, the contact plate 304, and the control plate 302, the size of the volume 318 (i.e., by changing the height H), and the composition of the gas filling the volume 318. As air typically provides the heat transfer medium in the volume 318 (i.e., the volume 318 communicating with the internal volume 432 through the vent 316), changing the pressure (and thus the density of air) within the volume 318 will correspondingly change the rate of heat transfer. Substituting another gas (i.e., nitrogen) for air will also change the rate of heat transfer across the volume 318.

The second primary heat transfer path is from the wafer 114, through the substrate support 400, through the contact plate 304, into the first disk-shaped portion 306 of the control plate 302, through the ring 310, into the second disk-shaped portion 308 and into the facility's water flowing through the passage 312. The rate of heat transfer across this path can be varied by changing the material composition of the substrate support 400, the contract plate 304, the control plate 302, and by varying the geometry of the ring 310 (i.e., by primarily changing the height H and thickness T of the ring 310). The second primary path carries the majority of heat transferred along the primary paths.

The secondary path of heat transfer is from the wafer 114, through the substrate support 400, around the isolator 466, into the external heat transfer plate 408 and into the facility's water flowing through the passage 418. Heat may also be transferred along this path from the substrate support 400 to the external heat transfer plate 408 through the hardware holding the support pedestal 116 together. The rate of heat transfer is also effected by changing the thickness W' of the isolator 466.

As the rate of heat transfer of the primary path exceeds the rate of heat transfer of the secondary path, the tendency of the wafer 114 to heat and cool more quickly in the center is compensated. Thus, uniform temperature is maintained across the wafer diameter. The actual heat transfer rates and balance between the primary and secondary paths are dependent on the pedestal/wafer geometry and the processing parameters to which the wafer 114 is to be subjected.

In order to maintain the predetermined temperature at the wafer 114, the rate of heat transfer to and from the wafer 114 must be balanced. The controller 140 facilitate the balancing of the rate of heat transfer to and from the wafer 114. The sensor 422 residing in the substrate support 400 communicates with the controller 140, supplying wafer temperature information. If the controller 140 determines that the wafer 114 requires heating, the controller 140 sends a signal to the second electrode 436, causing the heat generated by such second electrode 436, and transferred to the wafer 114 to exceed the heat removed from the wafer 114 (i.e., a net increase in thermal energy of the wafer 114). If the controller 140 determines that heat needs to be removed from the wafer 114, the controller 140 sends a signal to at the second electrode 436, causing the heat generated by the second electrode 436 and transferred to the wafer 114 to be exceeded by the heat removed from the wafer 114 (i.e., a net decrease in thermal energy of the wafer 114). The sensor 422 and the controller 140 continually monitor the wafer 114 temperature, sending the appropriate signals to the second electrode 436 as to maintain the wafer 114 at a predetermined temperature.

Since the heating and cooling requirements vary dependent on the type of process being performed in the chamber, the attributes listed above may be varied by one skilled in the arts to optimally handle the expected heat load requirements for a specific application.

The reader should note that although the invention is disclosed illustratively as an electrostatic chuck in a etch chamber, use of the invention can be advantageously applied in other applications such as semiconductor wafer supports, heaters, and the like where the control of wafer temperatures is important. Although the teachings of the present invention that have been shown and described in detail herein, those skilled in the art can readily devise other varied embodiments that still incorporate the teachings and do not depart from the spirit of the invention.

What is claimed is:

1. An apparatus for support and temperature control of a workpiece comprising:

a substrate support;

an annular ceramic isolator disposed against said substrate support, and; an external heat transfer plate disposed against said isolator opposite and spaced from said substrate support.

2. The apparatus of claim 1 wherein said isolator and said substrate support define an internal volume.

3. The apparatus of claim 2 further comprising:

an internal plate disposed with said internal volume.

4. The apparatus of claim 3 further comprising:

a gap defined between said internal plate and said substrate support.

5. The apparatus of claim 3 further comprising:

a first internal heat transfer fluid passage within said external heat transfer plate, and;

a second internal heat transfer fluid passage within said internal plate.

6. The apparatus of claim 3 wherein said substrate support comprises a heater.

7. The apparatus of claim 3 wherein said substrate support comprises a ceramic body.

8. The apparatus of claim 3 wherein said substrate support comprises an electrostatic chuck.

9. The apparatus of claim 2 wherein said internal volume is vented to atmosphere.

10. The apparatus of claim 3 further wherein the internal plate further comprises:

a first section;

a second section; and a ring shaped section connecting said first section and said second section.

11. The apparatus of claim 10 further comprising a volume defined by said ring shaped section, said first section and said second sections, vented to said internal volume.

12. The apparatus of claim 10 further comprising:

a first internal heat transfer fluid passage within said external heat transfer plate, and;

a second internal heat transfer fluid passage within said second section of said internal plate.

13. An apparatus for support and temperature control of a workpiece comprising:

a substrate support;

an annular ceramic isolator disposed against said substrate support, and having an internal volume;

an external heat transfer plate disposed against said isolator opposite said substrate support; and an internal heat transfer plate disposed within said internal volume.

14. The apparatus of claim 13 wherein said internal heat transfer plate further comprises:

a ring shaped section within said internal heat transfer plate defining a volume.

15. The apparatus of claim 13 wherein said internal heat transfer plate further comprises:

a first section;

a second section; and a ring shaped section connecting said first section and said second section defining a volume.

16. The apparatus of claim 15 further comprising:

a vent in said second section allowing said volume to be vented to said internal volume.

17. The apparatus of claim 15 wherein said internal volume is vented to atmosphere.

18. The apparatus of claim 13 wherein said substrate support comprises an electrostatic chuck.

19. The apparatus of claim 13 wherein said substrate support comprises a heater.

20. The apparatus of claim 13 wherein said substrate support comprises a ceramic body.

21. A semiconductor processing system comprising:

a process chamber;

a support pedestal disposed within said process chamber, said support pedestal having a substrate support with one or more embedded electrodes, a sensor for detecting the temperature of the substrate support, an annular ceramic isolator disposed against said substrate support and having an internal volume, an external heat transfer plate disposed against said isolator and, an internal heat transfer plate disposed within said internal volume; and a controller coupled to said sensor and said one or more embedded electrodes.

22. The semiconductor processing system of claim 21 further comprising:

a gap defined by said internal heat transfer plate and said substrate support.

23. The semiconductor processing system of claim 21 wherein the internal plate further comprises:

a first section;

a second section; and a ring shaped section connecting said first section and said second section.

24. A method for maintaining a semiconductor wafer at a uniform temperature on a support pedestal, said support pedestal having a substrate support connected to an isolator having an internal volume, an internal heat transfer plate disposed within said internal volume, and an external heat transfer plate connected to said isolator, the method comprising the steps of:

providing the wafer on said substrate support;

regulating heat transfer along a first path defined between said substrate support and said external heat transfer plate at a first rate to a heat transfer fluid circulating through said external heat transfer plate; and regulating heat transfer along a second path defined between said substrate support and said internal heat transfer plate at a second rate to a heat transfer fluid circulating through said internal heat transfer plate.

25. The method of claim 24 wherein the step of transferring heat between the internal heat transfer plate and the substrate support along the second path further comprises the step of:

transferring heat across a gap defined between the internal heat transfer plate and the substrate support.

26. The method of claim 24 wherein the step of transferring heat between the internal heat transfer plate and the substrate support along the second path further comprises the step of:

transferring heat across a ring shaped section in said internal heat transfer plate.

27. The method of claim 24 comprising the additional steps of:

measuring the wafer temperature at said substrate support;

generating a signal in response to said measured temperature for controlling the rate of heat transfer between the internal heat transfer plate and the substrate support.

* * * * *